US009085732B2

(12) United States Patent
Zeng et al.

(10) Patent No.: US 9,085,732 B2
(45) Date of Patent: Jul. 21, 2015

(54) MILLISECOND DECAY PHOSPHORS FOR AC LED LIGHTING APPLICATIONS

(75) Inventors: Qinghua Zeng, Fremont, CA (US); Gang Wang, Milpitas, CA (US); Yi-Qun Li, Danville, CA (US)

(73) Assignee: Intematix Corporation, Fremont, CA (US)

( * ) Notice: Subject to any disclaimer, the term of this patent is extended or adjusted under 35 U.S.C. 154(b) by 727 days.

(21) Appl. No.: 13/418,229

(22) Filed: Mar. 12, 2012

(65) Prior Publication Data

US 2012/0229038 A1    Sep. 13, 2012

Related U.S. Application Data

(60) Provisional application No. 61/451,997, filed on Mar. 11, 2011.

(51) Int. Cl.
| | | |
|---|---|---|
| *H05B 37/00* | (2006.01) | |
| *C09K 11/77* | (2006.01) | |
| *H05B 33/14* | (2006.01) | |
| *H01L 33/50* | (2010.01) | |

(52) U.S. Cl.
CPC .......... *C09K 11/7734* (2013.01); *H01L 33/502* (2013.01); *H05B 33/145* (2013.01)

(58) Field of Classification Search
CPC ...... H01L 33/50; H01L 33/501; H01L 33/502
USPC ....................... 315/185 R, 192, 246, 250, 312
See application file for complete search history.

(56) References Cited

U.S. PATENT DOCUMENTS

| | | | |
|---|---|---|---|
| 5,998,925 A | 12/1999 | Shimizu et al. | |
| 6,294,800 B1 | 9/2001 | Duggal et al. | |
| 6,945,672 B2 | 9/2005 | Du et al. | |
| 7,138,660 B2 | 11/2006 | Ota et al. | |
| 7,157,746 B2 | 1/2007 | Ota et al. | |
| 7,213,942 B2 | 5/2007 | Jiang et al. | |
| 7,309,151 B2 | 12/2007 | Mok et al. | |
| 7,679,101 B2 | 3/2010 | Ota et al. | |
| 7,740,514 B2 | 6/2010 | Setlur et al. | |
| 7,786,659 B2 | 8/2010 | Oaku et al. | |
| 8,188,687 B2 * | 5/2012 | Lee et al. | 315/323 |
| 8,324,840 B2 * | 12/2012 | Shteynberg et al. | 315/308 |

(Continued)

OTHER PUBLICATIONS

International Searching Authority, International Search Report and Written Opinion for PCT/US2012/028817, Jul. 11, 2012, 13 pages.
Liu et al., "Luminescence and energy transfer in $Ca_3Sc_2Si_3O_{12}:Ce^{3+}$, $Mn^{2+}$ white LED phosphors," Journal of Luminescence, Dec. 24, 2011 (e-publication), vol. 133, pp. 21-24.

*Primary Examiner* — Jeffrey Zweizig
(74) *Attorney, Agent, or Firm* — David H. Jaffer; Pillsbury Winthrop Shaw Pittman LLP

(57) ABSTRACT

Chlorosilicate-based phosphors configured to emit yellow-green light in a wavelength ranging from about 500 nm to about 560 nm in response to an excitation source emitting at about 400 nm to about 480 nm, wherein the light emitted by the phosphor has a decay time ranging from about 1 millisecond (1 ms) to about 10 milliseconds (10 ms). The phosphor comprises a compound of the family $Ca_{8-x-y}A_xEu_yMg_{1-m-n}B_mMn_n(Si_{1-s}C_sO_4)_4R_2$, where A is at least one divalent cation including Ca, Sr, Ba; B is Zn or Cd, or a divalent metal ion other than an alkaline earth; C is a cation, including at least one of Ge, Al, B, Gd, Ga, and N, and R is an anion, including F, Cl, Br, I, all respectively either individually, or in combinations.

28 Claims, 18 Drawing Sheets

(56) References Cited

U.S. PATENT DOCUMENTS

| | | | |
|---|---|---|---|
| 8,497,621 B2 * | 7/2013 | Kraus | ................. 313/486 |
| 8,807,799 B2 | 8/2014 | Li et al. | |
| 2002/0146835 A1 | 10/2002 | Modzelewski et al. | |
| 2004/0159846 A1 | 8/2004 | Doxsee et al. | |
| 2010/0219428 A1 | 9/2010 | Jung et al. | |
| 2010/0295458 A1 | 11/2010 | Cheng et al. | |
| 2013/0187556 A1 | 7/2013 | Zeng et al. | |

* cited by examiner x1000 x2000

5ms                    ~8 ms

MILLISECOND DECAY PHOSPHORS FOR AC LED LIGHTING APPLICATIONS

CROSS-REFERENCE TO RELATED APPLICATION

The present application claims benefit of and priority to U.S. Patent Application No. 61/451,997, entitled "Millisecond decay phosphor for AC lighting," by Qinghua Zeng et al., filed Mar. 11, 2011. U.S. Patent Application No. 61/451,997 is hereby incorporated by reference in its entirety.

BACKGROUND OF THE INVENTION

1. Field of the Invention

Embodiments of the present invention are directed to phosphor compositions emitting yellow-green light in a wavelength ranging from about 500 to about 560 nm, wherein the emitted light has a decay time of ranging from about 1 ms to about 10 ms. Moreover embodiments of the invention relate to AC operable white light emitting devices and lighting systems utilizing such phosphors.

2. Description of the Related Art

Wavelength conversion methods that use excitation light produced by solid-state light sources, such as laser diodes (LDs) or light emitting diodes (LEDs), and photoluminescence wavelength converting materials, such as phosphors and quantum dots can produce bright light at wavelengths that are different from the wavelengths of the excitation light. In conventional devices, excitation light impinges on a wavelength conversion material which absorbs the excitation light and emits light at a wavelength higher than the wavelength of the excitation light.

It is now common to implement white light sources, such as solid-state white light sources, using photoluminescence wavelength conversion materials. An LED that is capable of generating excitation light with wavelengths in the UV or blue region of the electromagnetic spectrum is used in conjunction with the excitation light source to generate, for example, white light. As taught in U.S. Pat. No. 5,998,925, lighting systems based on white LEDs may include one or more photoluminescence materials (e.g. phosphors), capable of absorbing a portion of the radiation emitted by the radiation emitted by the LED, thereby generating emitted radiation of a different wavelength (e.g. color). Typically, the LED chip or die generates blue light, and the phosphor(s) absorbs a percentage of the blue light, in turn emitting yellow, or a combination of red and green light, green and yellow light, green and orange light, or yellow and red light. The portion of the blue light generated by the LED that is not absorbed by the phosphor is combined with the light emitted by the phosphor; this produces a product light that appears to the human eye to be nearly or substantially white in character.

A lighting system requires, of course, a source of electrical power. Such electrical power sources may be operate in either a DC (direct current) or AC (alternating current) mode. When a DC drive is used to power the source of the excitation light (e.g. the LED), a relatively continuous current level is maintained in the electrical source current. Therefore, for DC-based lighting applications, the photoluminescence materials used in the wavelength conversion components preferably have decay times of less than a millisecond, so that light from the lighting system can be turned on and off in an immediate fashion, in response to the electrical switch being turned on and off, respectively.

It is also possible that an alternating current (AC) source may be used to drive an LED lighting system. When an AC power supply is used, the electrical current in the circuit forms a wave pattern that "alternates" between two different current levels, where mathematically, the pattern may be described by a sine wave. An LED that is operable with AC current is called an AC LED. A rectifier may be used to provide a doubling of the frequency of the input current driving the AC LED. The rectifier may be implemented in simple rectifying circuitry, without a capacitor or complex integrated circuit (IC) components, whose purpose would have been to obviate the need of an electrolytic smoothing capacitor(s). The reason for avoiding electrolytic smoothing capacitors is that they have a lifetime which is often much less than the life expectancy of the LED chip.

There is a need in the art for phosphor compositions that are optimized for use in AC LED based lighting systems. Such phosphor compositions are configured for long decay times in their photoluminescence emissions; this is so that the decaying light can be used to fill "gaps" in luminescence that otherwise would have occurred without a ling decay phosphor. The "gaps," or periods of low luminosity are due to the fact that the AC power is cycling to fully on states, through zero (fully off states), to fully on states again in the opposite polarity.

SUMMARY OF THE INVENTION

Disclosed herein are chlorosilicate-based phosphors configured to emit yellow-green light in a wavelength ranging from about 500 nm to about 560 nm in response to an excitation source emitting at about 400 nm to about 480 nm, wherein the light emitted by the phosphor has a decay time ranging from about 1 millisecond (1 ms) to about 10 milliseconds (10 ms). The composition of the phosphor comprises $Ca_{8-x-y}A_xEu_yMg_{1-m-n}B_mMn_n(Si_{1-s}C_sO_4)_4R_2$, where A is at least one divalent cation including Ca, Sr, Ba, individually or in combinations, or a combination of +1 and +3 cations; B is Zn or Cd, or a divalent metal ion other than an alkaline earth, present either individually or in combinations; C is a +3, +4, or +5 cation, including at least one of Ge, Al, B, Gd, Ga, and N, either individually or in combinations, and R is a −1, −2, −3 anion, including F, Cl, Br, I, either individually, or in combinations. The value of the sum of the parameters x+y is any value less than about 8, and the value of the sum of the parameters m+n is any value less than about 1. The value of the s parameter is any value less than about 1.

In one embodiment, the decay time is created by the time it takes for a transfer of energy in a composition having both $Eu^{2+}$ and $Mn^{2+}$ ions; the transfer of energy being from an $Eu^{2+}$ ion to an $Mn^{2+}$ ion. Both types of ions function together to transfer energy efficiently; samples with no $Eu^{2+}$ will not efficiently photoluminescence, and samples with no $Mn^{2+}$ will not exhibit a decay time. In one embodiment of the invention, a desired ratio of $Eu_{2+}$ ions to $Mn_{2+}$ ions is about 0.2/0.4. In another embodiment, the chlorosilicate phosphor has the formula $Ca_{8-x}Eu_xMg_{1-y}Mn_y(SiO_4)_4Cl_2$, where x ranges from about 0.16 to 0.24, and y ranges from about 0.3 to about 0.5.

One embodiment of the present invention comprises a white light emitting device comprising: a plurality of LEDs configured to be directly operable from an AC power supply and which generate blue excitation light; and at least one photoluminescence material configured to absorb at least a part of the excitation light and in response emit yellow and/or green light; wherein the photoluminescence material has a decay time of at least one millisecond.

In an embodiment of the present invention, the white light emitting device described in the paragraph above, includes a photoluminescence material configured such that the decay time of the material reduces flicker in emitted light. In an embodiment of the present invention, the LEDs are configured as a part of a bridge rectifier arrangement. Alternatively, the LEDs may be configured as at least two strings of serially connected LEDs, wherein the strings are connected in parallel and in an opposite polarity.

In one embodiment of the present invention, the photoluminescence material has the formula $Ca_{8-x}Eu_xMg_{1-y}Mn_y(SiO_4)_4Cl_2$, where the x is 0.2, and y is 0.4.

The photoluminescence material can be provided remotely to the plurality of LEDs such as for example as part of an optical component that is in a spaced relationship to one or more of the LEDs. Alternatively the photoluminescence material can provided on a light emitting surface of at least one of the plurality of LEDs such as for example within a light transmissive encapsulant on the LED.

In an embodiment of the present invention a white light lighting system comprises: a plurality of LEDs configured to be directly operable from an AC power supply having a drive cycle and which generate blue excitation light; and at least one photoluminescence material configured to absorb at least a part of the excitation light and in response emit yellow and/or green light; wherein the modulation depth (drop in intensity) of light emitted by the photoluminescence material over a single drive cycle is less than about 75%, that is over a single drive cycle the minimum intensity of light emitted by the photoluminescence material is at least 25% of the maximum intensity. Preferably the photoluminescence material is selected such that the modulation depth of light emitted by the photoluminescence material over a single drive cycle is less than about 50% and more preferably less than about 25%.

In an embodiment of the present invention a phosphor for AC LED lighting comprises a phosphor that is co-activated with manganese (Mn) and europium (Eu) and has a decay time of at least 1 ms. In some embodiments the phosphor comprises a chlorosilicate-based phosphor.

In a embodiment of the present invention a photoluminescence wavelength conversion component for an AC drivable LED light system comprises a photoluminescence material having a decay time of at least 1 ms. In some embodiments the component comprises a substantially planar light transmissive component such as for example a two dimensional sheet or plate. In other embodiments the component can comprise a solid or hollow three dimensional light transmissive component having convex or concave surfaces such as for example dome-shaped components such as a hemispherical shell or spherical shell or solid shapes including hemispherical and hemispherical shapes. The photoluminescence material can be incorporated within the component such that it is substantially homogeneously distributed throughout the volume of the component and/or provided as at least one layer on a surface of the component. Preferably the photoluminescence material comprises a phosphor co-activated with manganese and europium.

BRIEF DESCRIPTION OF THE DRAWINGS

In order that the present invention is better understood phosphor materials and white light emitting devices and lighting systems in accordance with embodiments of the invention are now be described, by way of example only, with reference to the accompanying drawings in which:

FIG. 7 is the Eu concentration;

FIGS. 5 and 7 is the Eu concentration;

DETAILED DESCRIPTION OF THE INVENTION

Figure 1:
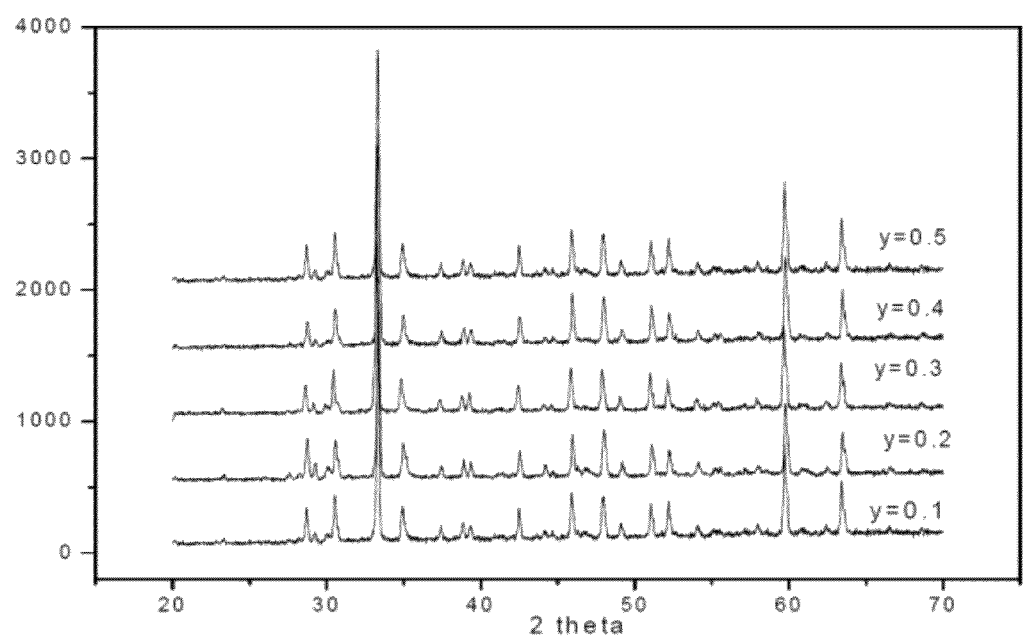
FIG. 1 shows a series of x-ray diffraction patterns of exemplary chlorosilicates represented by the formula $Ca_{8-x}Eu_xMg_{1-y}Mn_y(SiO_4)_4Cl_2$, where the europium (Eu) content, x, was fixed at 0.16 mol, and where y, the manganese (Mn) content, was varied as follows: y=0.1, 0.2, 0.3, 0.4, 0.5 mol.

Disclosed herein are chlorosilicate-based phosphors configured to emit yellow-green light in a wavelength ranging from about 500 nm to about 560 nm in response to an excitation source emitting at about 400 nm to about 480 nm, wherein the light emitted by the phosphor has a decay time ranging from about 1 millisecond (1 ms) to about 10 milliseconds (10 ms). The composition of the phosphor comprises $Ca_{8-x-y}A_xEu_yMg_{1-m-n}B_mMn_n(Si_{1-s}C_sO_4)_4R_2$, where A is at least one divalent cation including Ca, Sr, Ba, individually or in combinations, or a combination of +1 and +3 cations; B is Zn or Cd, or a divalent metal ion other than an alkaline earth, present either individually or in combinations; C is a +3, +4, or +5 cation, including at least one of Ge, Al, B, Gd, Ga, and N, either individually or in combinations, and R is a −1, −2, −3 anion, including F, Cl, Br, I, either individually, or in combinations The value of the sum of the parameters x+y is any value less than about 8, and the value of the sum of the parameters m+n is any value less than about 1. The value of the s parameter is any value less than about 1.

In one embodiment, the decay time is created by the time it takes for a transfer of energy in a composition having both $Eu^{2+}$ and $Mn^{2+}$ ions; the transfer of energy being from an $Eu^{2+}$ ion to an $Mn^{2+}$ ion. Both types of ions function together to transfer energy efficiently; samples with no $Eu^{2+}$ will not efficiently photoluminescence, and samples with no $Mn^{2+}$ will not exhibit a decay time. In one embodiment of the invention, a desired ratio of $Eu_{2+}$ ions to $Mn_{2+}$ ions is about 0.2/0.4. In another embodiment, the chlorosilicate phosphor has the formula $Ca_{8-x}Eu_xMg_{1-y}Mn_y(SiO_4)_4Cl_2$, where x ranges from about 0.16 to 0.24, and y ranges from about 0.3 to about 0.5.

The Need for Long Decay Time Phosphors

One embodiment of the invention is to use long decay phosphors on phosphors pumped by an AC driven LED or LED array. When a single LED or LED array is directly pumped by an AC driver, the LED die emits light constantly. The AC voltage applied to the LED (or array of LEDs) has to exceed a threshold value to make the LED emit light. As a result, the LED turns on and off at the same frequency, or a double the frequency, when the AC driving power sweeps between zero, and its peak value. This causes the LED to flicker. As a typical AC line power has a frequency of 50 or 60 Hz, the LED will flicker at a frequency of 50 to 60 Hz, or double that frequency, 100/120 Hz. The presence of flickering can significantly influence the perceived quality of a light source to a human observer. Light flickering at 100/120 Hz is not normally perceived by a human, but there are concerns nonetheless.

In addition to flickering at a given frequency, there is another condition known as "modulation depth" which also affects the quality of the light originating from a flickering light source. Modulation depth is defined as the ratio of deviation to the maximum light output of a light source within an AC duty cycle. Smaller modulation depths indicate that output of a light source is more uniform over time. The human eye finds it more difficult to sense the flicker from a small modulation depth light source than a maximum modulation source that is 100 percent on and off during a duty cycle.

When a decay phosphor is used, the LED light source continues to emit light during the decay period. For a 50 to 120 Hz flickering frequency, the LED off period is normally about 1 ms to about 10 ms. A long decay phosphor can effectively fill the gap and reduce the modulation depth of a light source.

In another embodiment of the present invention, a long decay phosphor (also known as a millisecond decay phosphor) is applied to a simplified DC driver that lacks a capacitor to control the ripple voltage. This kind of driver may be as simple as a rectifier. This kind of driver has the advantage of being simple and low cost, while at the same time demonstrating a long lifetime and high efficiency, and as such, it is commonly used in LED lighting. Similarly, a long decay phosphor can improve the modulation depth of the DC driver pump LED light output when the ripple voltage is high in the driver design. With embodiments of the invention, usage of the long decay photoluminescent material will smooth out the light output from such AC lighting systems, even without a smoothing capacitor, which eliminates and/or significantly reduces flickering. In some embodiments the long decay photoluminescent material can be considered to provide optical smoothing of the light output in an analogous manner to which a capacitor provides electrical smoothing. This allows the AC-lighting system to maintain the advantage of using a simple driver without a capacitor to have a lower cost and a longer life time, while also getting avoiding unwanted AC-related artifacts such as flickering.

In another embodiment of the present invention, a long decay phosphor (e.g., millisecond decay phosphor) is used in conjunction with a dimmable LED source using pulse width modulation (PWM). Most LED dimmers use pulse width modulation to dim an LED's output, and 120 Hz is a commonly used as the dimming frequency. The use of a long decay phosphor in this device can make the pulse width modulation dimming more like DC dimming, which in turn reduces the flickering caused by the pulse width modulated signal.

In another embodiment of the present invention, when using a long decay phosphor (millisecond decay phosphor) together with an LED and the driver disclosed above, the phosphor is not necessarily packaged inside the LED. Alternatively, the phosphor may be positioned in the fixture remotely. In this embodiment, a long decay remote phosphor is used in conjunction with a blue LED.

Mechanism of Operation of Long Decay Time Phosphors

The divalent manganese ion usually emits light characteristically in the green or red region of the electromagnetic spectrum. The luminescence of $Mn^{2+}$ consists of broad d-d emission band which may be ascribed to the forbidden transition from the excited state $^4T_1$ to the ground state $^6A_1$. The emission color of $Mn^{2-}$ activated compound varies from green to red with the changing of the matrix, the coordination number of $Mn^{2+}$, and the strength of the ligand field. Due to its forbidden transition, the decay time from $^4T_1$ to $^6A_1$ is in milliseconds range. The decay time changes with the concentration of Mn. The decay time is reduced at higher doping Mn concentrations. However, with a higher Mn content concentration quenching can occur, and the color coordinates shift as a result. Thus, it is known that there is a trade-off between the decay time, the brightness, and the concentration of Mn.

In general, however, $Mn^{2+}$ activated compounds demonstrate only weak absorption in UV to blue region, and a sensitizer is often used in practical applications. The emission of $Mn^{2+}$ may be greatly enhanced by the host matrix, itself, or by addition of ions such as $Eu^{2+}$, $Pb^{2+}$ and $Ce^{3+}$, etc. to the host matrix.

As an example, FIG. 1 shows the energy transfer between $Eu^{2+}$ and $Mn^{2+}$ according to the present embodiments. After absorbing the excitation energy from 450 nm LED chips, the $Eu^{2+}$ in the compound show an emission at around 515 nm, which is then transferred to the $Mn^{2+}$ ions, with emission at around 547 nm. Such energy transfer efficiency is strongly dependent on the concentration ratio between $Eu^{2+}$ and $Mn^{2+}$ ions. An appropriated concentration of $Eu^{2+}$ is needed in the compounds so that the energy can be transferred efficiently to $Mn^{2+}$ The intensity ratio between $Eu^{2+}$ emission and $Mn^{2+}$ emission can be varied with different concentration ratio between $Eu^{2+}$ and $Mn^{2+}$ By adjusting the Eu concentration, the emission with peak at 515 nm can be almost eliminated and a purer color emission of $Mn^{2+}$ at 547 nm will be substantially the only emission peak observed, which is more favorable for certain applications.

TABLE 1

The decay time of the $Mn^{2+}$ transition as a function of Mn concentration in $Ca_{7.6}Eu_{0.4}Mg_{1-y}Mn_y(SiO_4)_4Cl_2$

| $Ca_{7.6}Eu_{0.4}Mg_{1-y}Mn_y(SiO_4)_4Cl_2$ | Decay time (ms) |
|---|---|
| y = 0.1 | 2.9 |
| y = 0.2 | 3.1 |
| y = 0.3 | 3.0 |

Characterization of the Inventive Chlorosilicates

Figure 2:
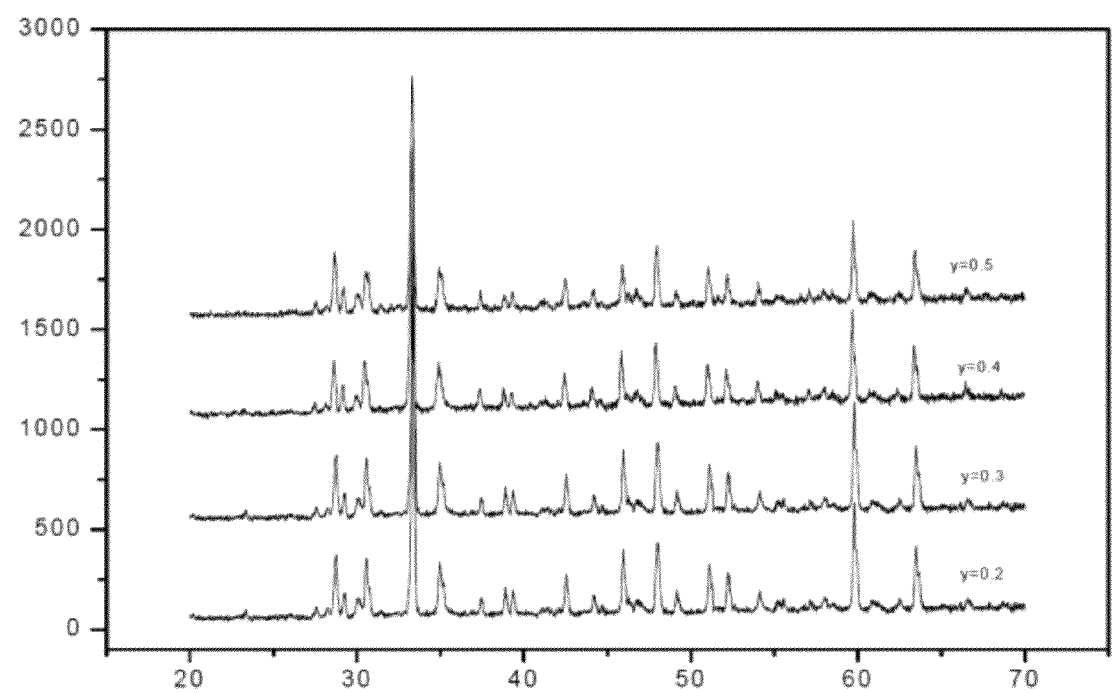
FIG. 2 shows a series of x-ray diffraction patterns of the exemplary chlorosilicates represented by the formula $Ca_{8-x}Eu_xMg_{1-y}Mn_y(SiO_4)_4Cl_2$, where in this series the Eu content was fixed at x=0.2 mol, and the Mn content varied as follows: y=0.2, 0.3, 0.4, 0.5 mol.
Figure 3:
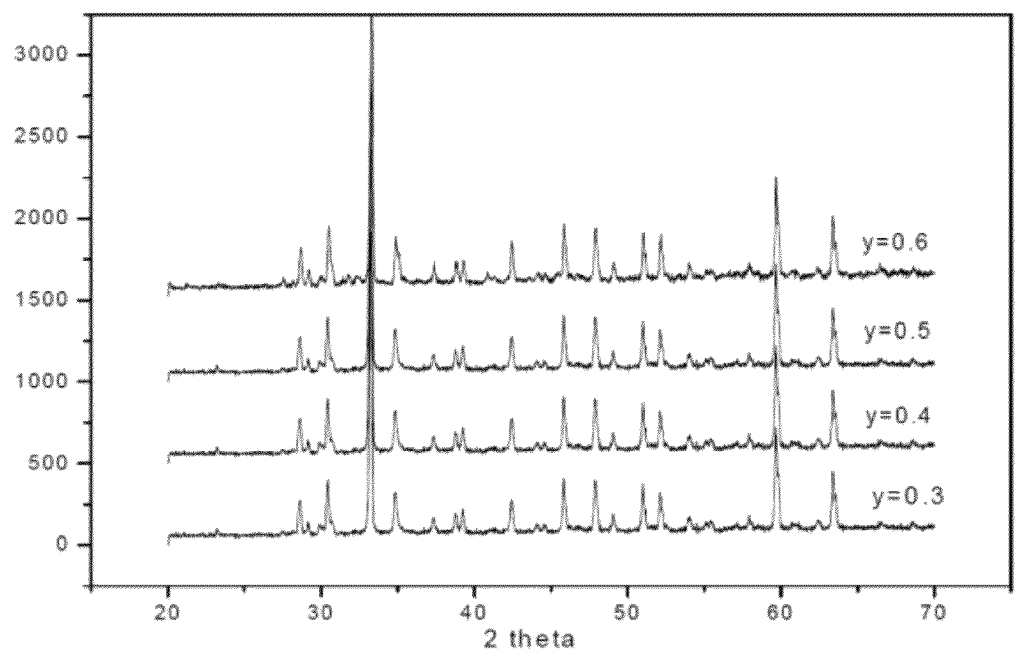
FIG. 3 shows a series of x-ray diffraction patterns of the exemplary chlorosilicates represented by the formula $Ca_{8-x}Eu_xMg_{1-y}Mn_y(SiO_4)_4Cl_2$, where in this series the Eu content was fixed at x=0.3 mol, and the Mn content varied as follows: y=0.3, 0.4, 0.5, 0.6 mol.

FIGS. 1-3 each show a series of x-ray diffraction (XRD) patterns of the exemplary chlorosilicates represented by the formula $Ca_{8-x}Eu_xMg_{1-y}Mn_y(SiO_4)_4Cl_2$, where x, the Eu content, ranges from about 0.1 mol to about 0.5 mol, and the Mn content ranged from about 0.1 mol to about 0.6 mol. Specifically, in FIG. 1 the Eu content, x, was fixed at 0.16 mol, and where y, the Mn content, was varied as follows: y=0.1, 0.2, 0.3, 0.4, 0.5. In FIG. 2 the Eu content, x, was fixed at x=0.2 mol, and the Mn content varied as follows: y=0.2, 0.3, 0.4, 0.5 mol. In FIG. 3, the Eu content, x, was fixed at x=0.3 mol, and the Mn content varied as follows: y=0.3, 0.4, 0.5, 0.6 mol. For each of the series of chlorosilicates tested in FIGS. 1-3, both solid state reaction mechanisms and liquid co-precipitation methods were used to prepare the mixture before calcinations and sintering steps. The data of FIGS. 1-3 shows that at all Mn concentrations (and therefore at all of the Eu/Mn ratios tested in this series), the synthesis processes provided substantially single crystalline materials. It was also shown that the inventive chlorosilicates were in a single phase, and no impurity phases could be observed.

Figure 4A:
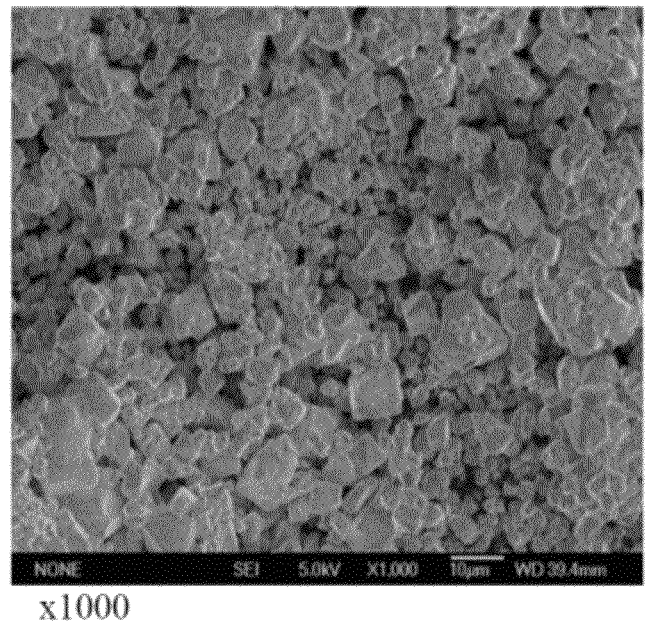
FIGS. 4A and 4B shows SEM images of the chlorosilicate $(Ca,Eu)_8(Mg,Mn)(SiO_4)_4Cl_2$ at 1000× and 2000× magnification respectively.
Figure 4B:
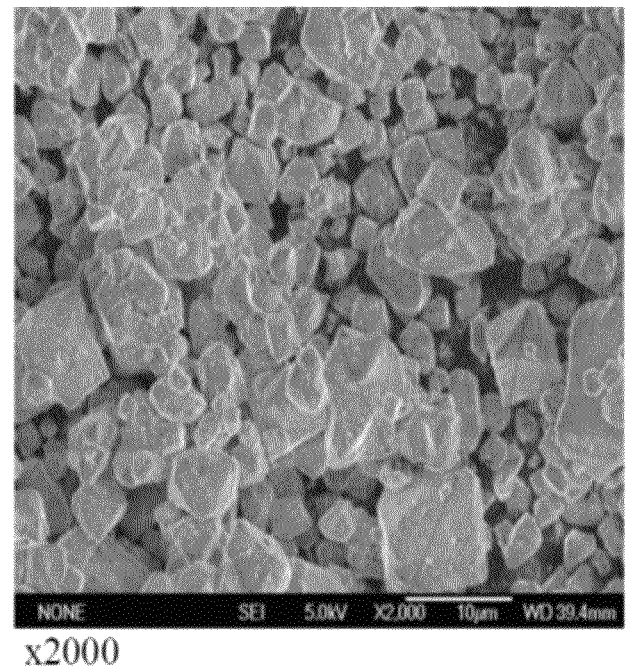

SEM (scanning electron microscopy) images of a generic chlorosilicate $(Ca,Eu)_8(Mg,Mn)(SiO_4)_4Cl_2$ are shown in FIG. 4 at 1000× and 2000× magnifications. The images show that the inventive chlorosilicates crystallized in a wide distribution range, starting at from less than 1 micrometer in size, up to more than 10 micrometers in size. This particle size range of <1 μm up to >10 μm is a feasible one for the inventive chlorosilicate phosphors to be used in LED applications.

Figure 5:
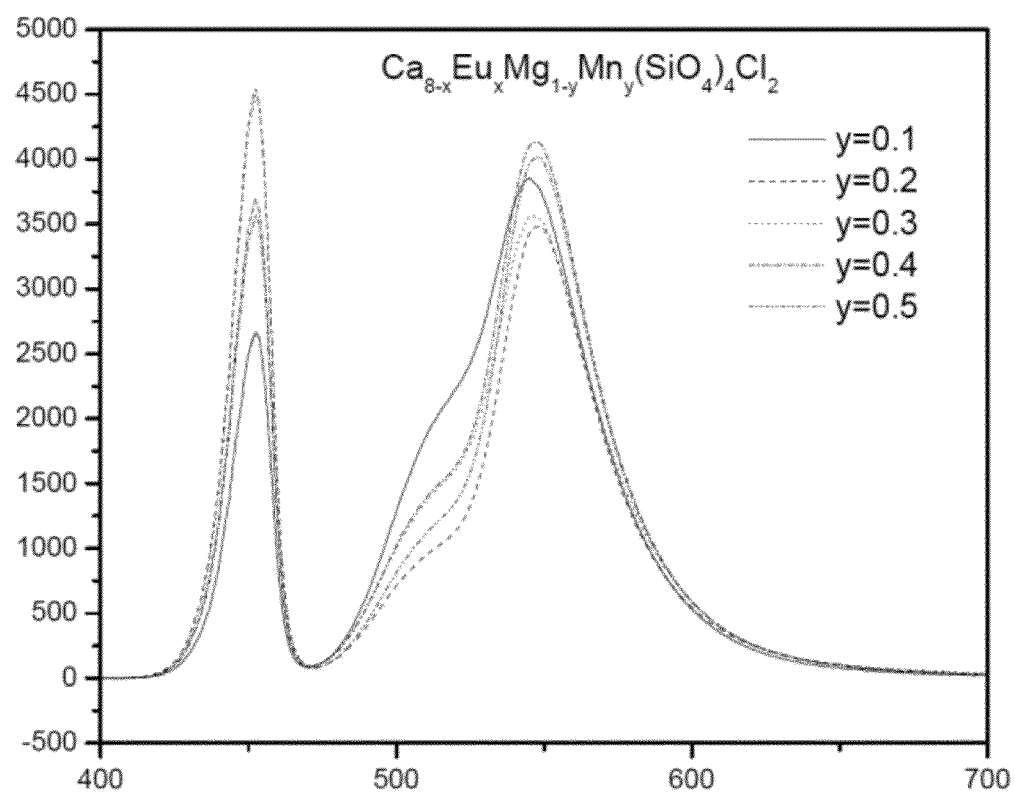
FIG. 5 shows a series of emission spectra of exemplary chlorosilicates represented by the formula $Ca_{8-x}Eu_xMg_{1-y}Mn_y(SiO_4)_4Cl_2$ under 450 nm blue LED excitation, where the Eu content, x, was fixed at 0.16 mol, and where y, the Mn content, was varied as follows: y=0.1, 0.2, 0.3, 0.4, 0.5 mol; this set of spectra investigates the role that Mn concentration plays in light emission.

FIG. 5 shows a series of emission spectra of the exemplary chlorosilicates represented by the formula $Ca_{8-x}Eu_xMg_{1-y}Mn_y(SiO_4)_4Cl_2$ under 450 nm blue LED excitation, where the Eu content, x, was fixed at 0.16 mol, and where y, the Mn content, was varied as follows: y=0.1, 0.2, 0.3, 0.4, 0.5; in other words, this set of spectra investigates the role that Mn concentration plays in emission. The peak of the emission is at around 547 nm, and there is a shoulder at around 515 nm. This shows that with increasing Mn concentration, the peak at 515 nm decreased while the peak intensity of 547 nm changes. The peak at around 517 nm is assigned to the emission of $Eu^{2+}$ in the hosts, while the peak at around 547 nm is assigned to the emission of Mn ions in the host. The CIE of the emission of the inventive chlorosilicates varies at different Mn contents under both UV and blue LED excitation.

Figure 6:
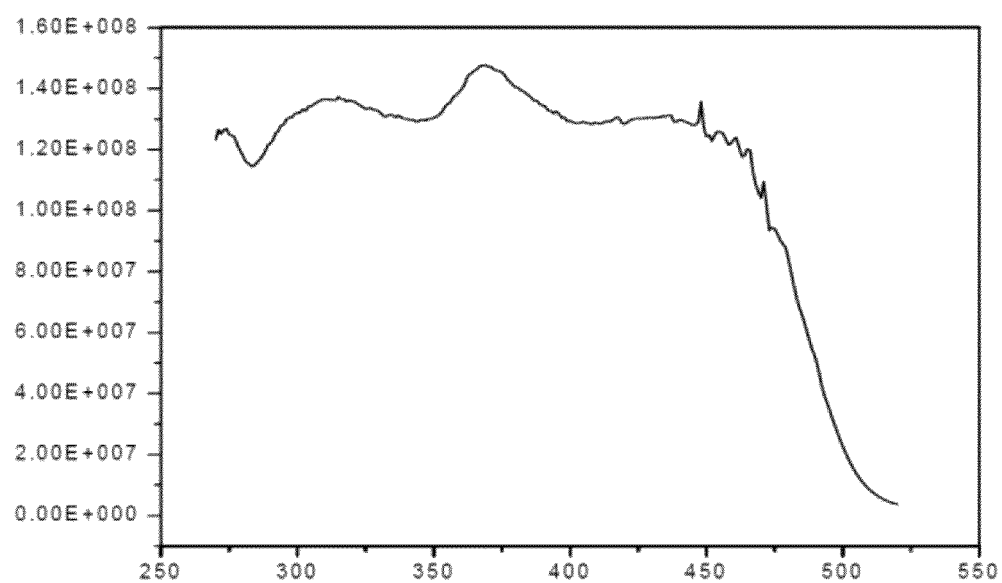
FIG. 6 is the excitation spectrum of an exemplary chlorosilicate having the formula $Ca_{8-x}Eu_xMg_{1-y}Mn_y(SiO_4)_4Cl_2$, where x=0.16, y=0.4, showing that the inventive materials absorb over a wide range of wavelengths, making them suitable of use in both UV and blue LED applications.

FIG. 6 is the excitation spectrum of an exemplary chlorosilicate having the formula $Ca_{8-x}Eu_xMg_{1-y}Mn_y(SiO_4)_4Cl_2$, where x=0.16, y=0.4. This graph illustrates that the material displays a broad band of absorption, from the UV to about 520 nm, and thus the inventive chlorosilicates are suitable for use in both UV and blue LED based applications.

Figure 7:
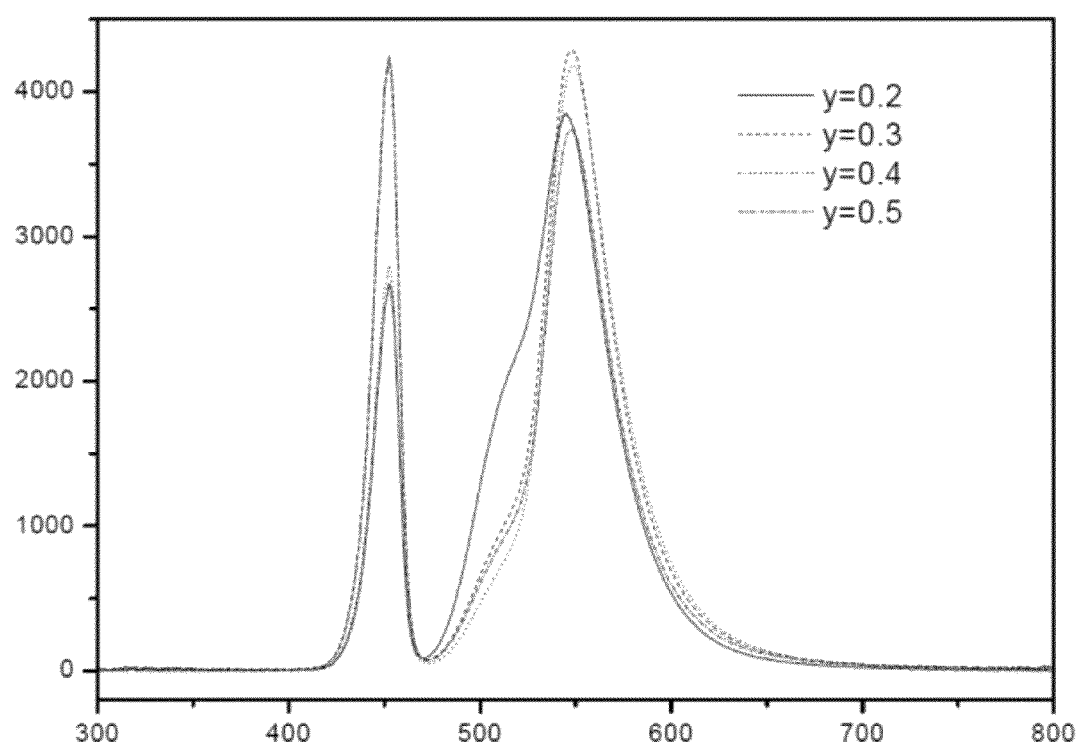
FIG. 7 shows a series of emission spectra of exemplary chlorosilicates represented by the formula $Ca_{8-x}Eu_xMg_{1-y}Mn_y(SiO_4)_4Cl_2$ under 450 nm blue LED excitation, where the Eu content, x, was fixed at 0.2 mol, and where y, the Mn content, was varied as follows: y=0.2, 0.3, 0.4, 0.5; this set of spectra further investigates the dependence of emission spectra on the Mn concentration: the difference between the data of FIG. 5

FIG. 7 shows a series of emission spectra of exemplary chlorosilicates represented by the formula $Ca_{8-x}Eu_xMg_{1-y}Mn_y(SiO_4)_4Cl_2$ under 450 nm blue LED excitation, where the Eu content, x, was fixed at 0.2 mol, and where y, the Mn content, was varied as follows: y=0.2, 0.3, 0.4, 0.5; this set of spectra further investigates the dependence of emission spectra on the Mn concentration: the difference between the data of FIG. 5 and FIG. 7 is the europium concentration. This set of spectra show that the peak of the emission is at around 547 nm, and a shoulder at around 515 nm. Increasing the Mn concentration caused the peak at 515 nm to decrease, while the peak intensity of 547 nm radiation changes. The peak at around 517 nm is assigned to the emission of $Eu^{2+}$ in the host, while the peak at around 547 nm is assigned to the emission of Mn ions in the host. The CIE of the emission of the invention varies at different Mn contents under UV and blue LED excitation.

Figure 8:
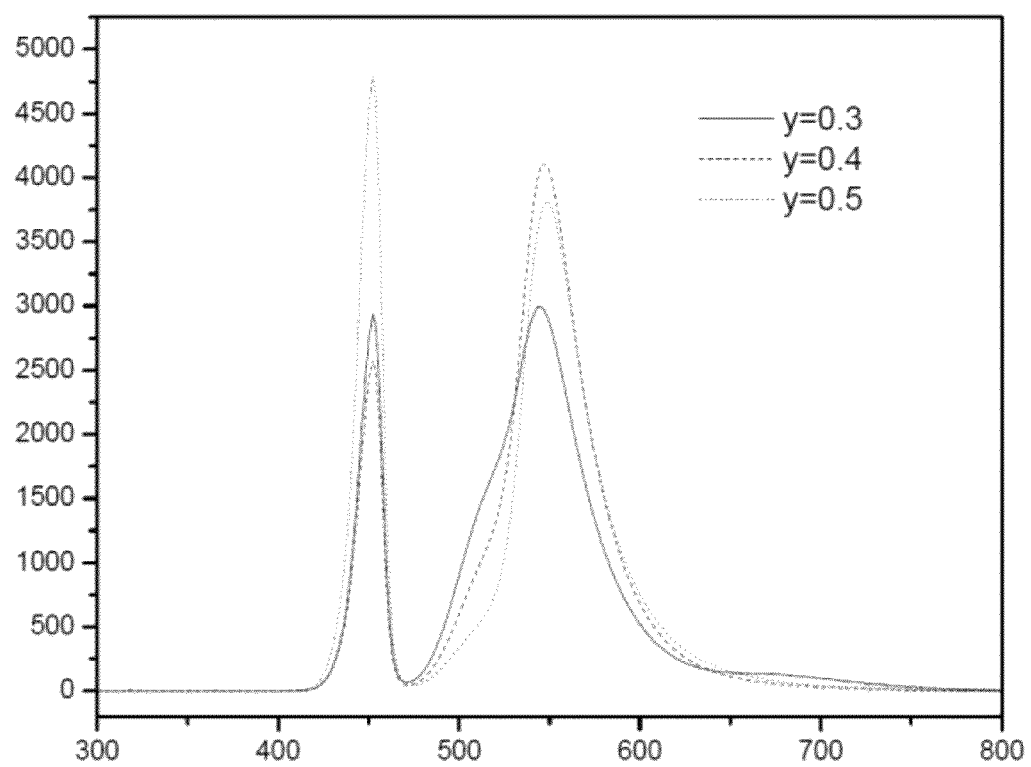
FIG. 8 shows a series of emission spectra of exemplary chlorosilicates represented by the formula $Ca_{8-x}Eu_xMg_{1-y}Mn_y(SiO_4)_4Cl_2$ under 450 nm blue LED excitation, where the Eu content, x, was fixed at 0.3 mol, and where y, the Mn content, was varied as follows: y=0.3, 0.4, 0.5; this set of spectra further investigates the dependence of emission spectra on the Mn concentration: the difference between the data of FIG. 8

FIG. 8 shows a series of emission spectra of exemplary chlorosilicates represented by the formula $Ca_{8-x}Eu_xMg_{1-y}Mn_y(SiO_4)_4Cl_2$ under 450 nm blue LED excitation, where the Eu content, x, was fixed at 0.3 mol, and where y, the Mn content, was varied as follows: y=0.3, 0.4, 0.5; this set of spectra further investigates the dependence of emission spectra on the Mn concentration: the difference between the data of FIG. 8 and FIGS. 5 and 7 is the europium concentration. The peak of the emission is at around 547 nm and there is a shoulder at around 515 nm. This shows that with increasing Mn concentration, the peak at 515 nm decreases, while the peak intensity of 547 nm changes. The peak at around 517 nm is assigned to the emission of $Eu^{2+}$ in the host, while the peak at around 547 nm is assigned to the emission of Mn ions in the host. The CIE of the emission of the inventive chlorosilicates varies at different Mn contents under UV and blue LED excitation.

Figure 9:
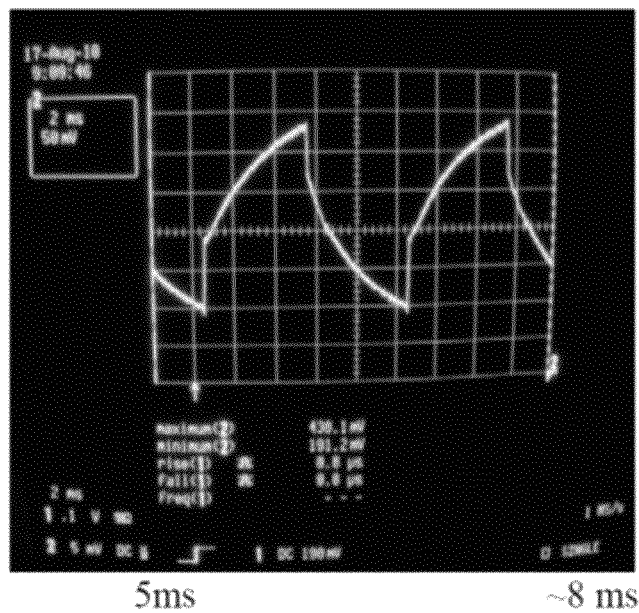
FIG. 9 is a decay curve of an exemplary $Ca_{8-x}Eu_xMg_{1-y}Mn_y(SiO_4)_4Cl_2$, where x=0.16, and y=0.4: a decay curve of the phosphor material may be observed clearly.
Figure 9:
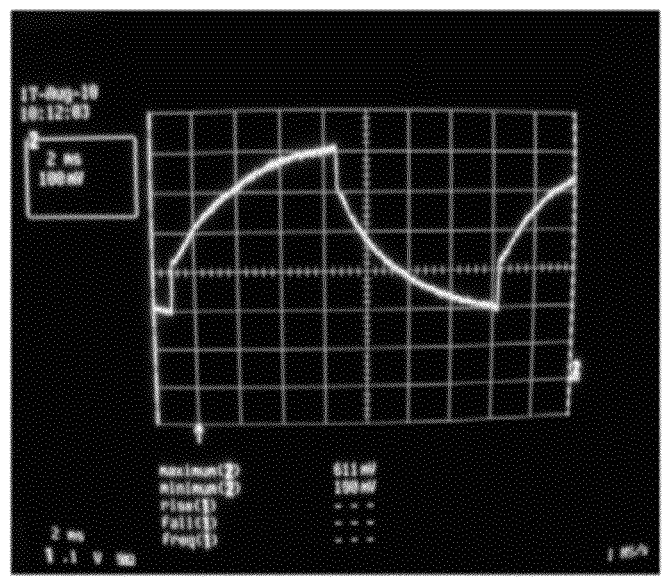

FIG. 9 is a decay curve of an exemplary $Ca_{8-x}Eu_xMg_{1-y}Mn_y(SiO_4)_4Cl_2$, where x=0.16, and y=0.4: a decay curve of the phosphor material may be observed clearly. For this experiment, the phosphor was packaged into a PLCC 3528 top view LED package. A square wave current signal was then applied to the LED to cycle it between on and off states: at an 8 ms interval for the data of FIG. 9a, and at a 5 ms interval for the data of FIG. 9b. An optical detector with a response speed of less than 1 microsecond was used to monitor the optical emission(s) of the LED. The decay curve attributable to the phosphor is clearly visible. At 5 milliseconds after ignition, the intensity of the emission of $Mn^{2-}$ in the invention is 43.6% and at 8 milliseconds, 34.0%, respectively.

Figure 10:
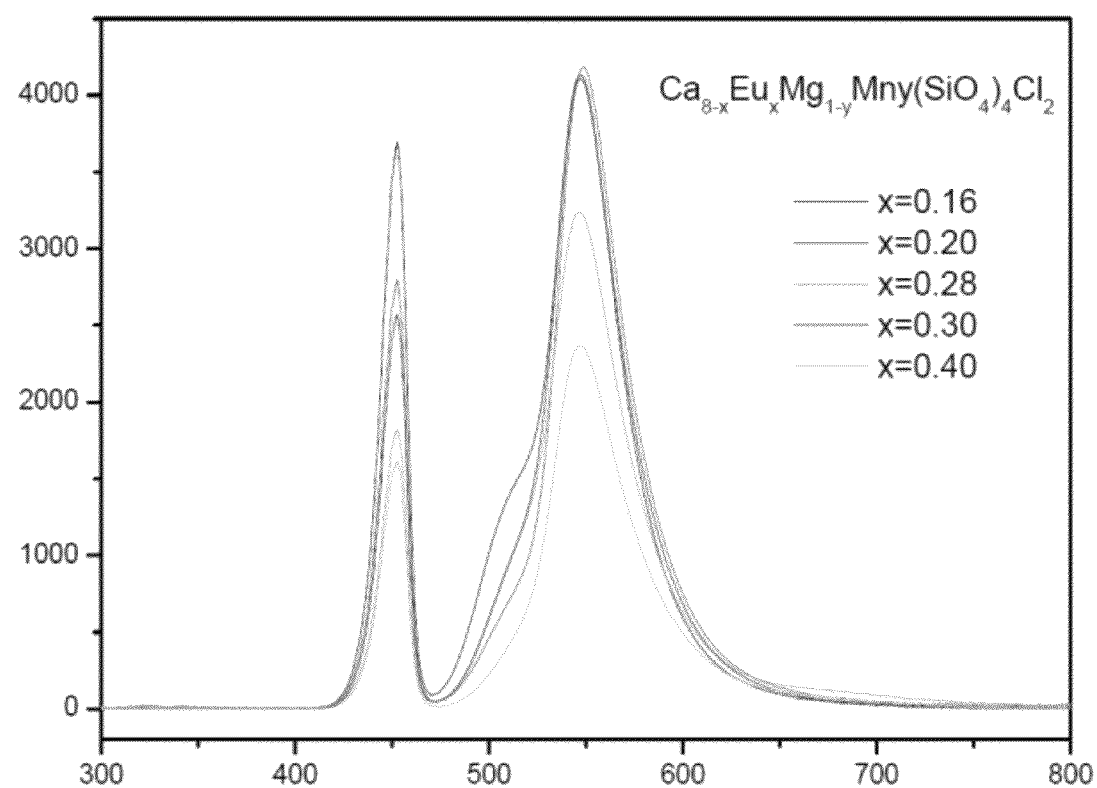
FIG. 10 shows a series of emission spectra produced by exemplary chlorosilicates having the formula $Ca_{8-x}Eu_xMg_{1-y}Mn_y(SiO_4)_4Cl_2$, where y=0.3, x=0.16, 0.2, 0.28, 0.3, 0.4 mol; in other words, for this set of experiments, it was the Mn concentration that was fixed, and the Eu concentration was varied.

FIG. 10 shows a series of emission spectra produced by exemplary chlorosilicates having the formula $Ca_{8-x}Eu_xMg_{1-y}Mn_y(SiO_4)_4Cl_2$, where y=0.3, x=0.16, 0.2, 0.28, 0.3, 0.4 mol; in other words, for this set of experiments, it was the Mn concentration that was fixed, and the Eu concentration was varied. The peak of the emission is at around 547 nm, and there is a shoulder at around 515 nm. This shows that with increasing Mn content, the peak at 515 nm decreases while the peak intensity of 547 nm changes. The peak at around 517 nm is assigned to the emission of $Eu^{2+}$ in the host, while the peak at around 547 nm is assigned to the emission of Mn ions in the host. The CIE of the emission of the invention varies at different Mn contents under UV and blue LED excitation.

Figure 11:
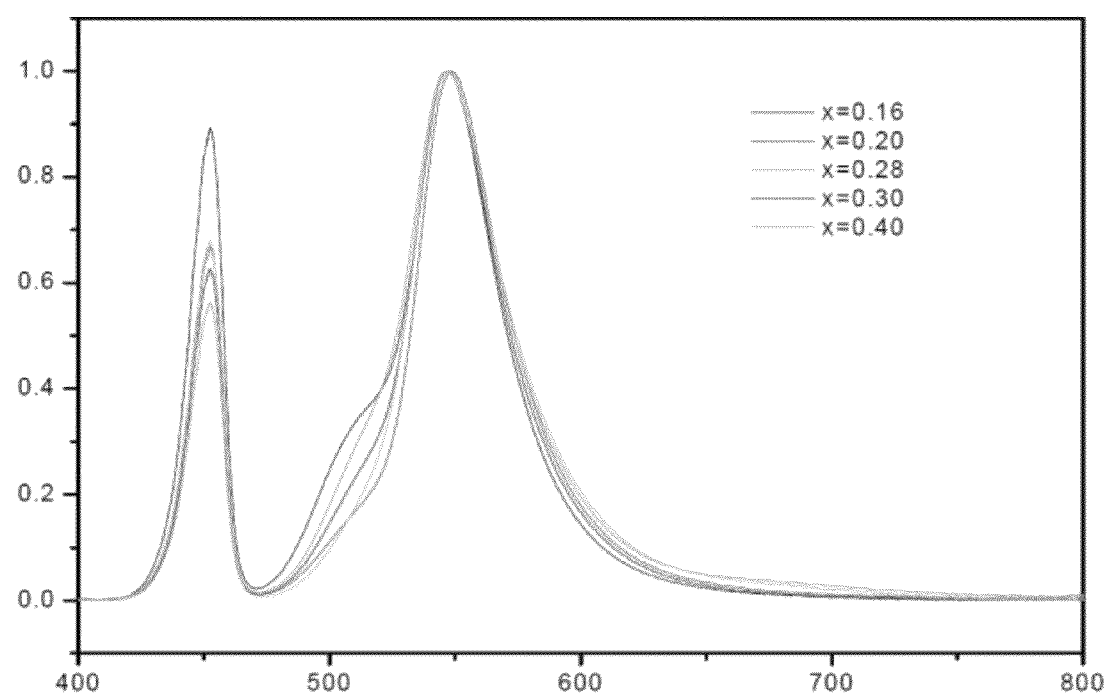
FIG. 11 is a normalized version of the spectra of FIG. 10.

FIG. 11 is a normalized version of the spectra of FIG. 10. Again, the exemplary chlorosilicates have the formula $Ca_{8-x}Eu_xMg_{1-y}Mn_y(SiO_4)_4Cl_2$, where y=0.3, and x=0.16, 0.2, 0.28, 0.3, 0.4 mol. The normalized data also show the emission having a peak at about 547 nm, and a shoulder at around 515 nm. The same observation as before may be made in the normalized data: increasing the Mn concentration, the peak at 515 nm decreased, while the peak intensity of 547 nm changes. The peak at around 517 nm is assigned to the emission of $Eu^{2+}$ in the host, while the peak at around 547 nm is assigned to the emission of Mn ions in the host.

Figure 12A:
FIGS. 12A and 12B is the decay curve of the exemplary $Ca_{8-x}Eu_xMg_{1-y}Mn_y(SiO_4)_4Cl_2$ (x=0.16, y=0.4), where a red phosphor has been included to illustrate white LED performance (CCT=5100K), and where data was measured at the two on-off time intervals of 5 millisecond (ms) and 10 millisecond, respectively, in FIGS. 12A and 12B.
Figure 12B:
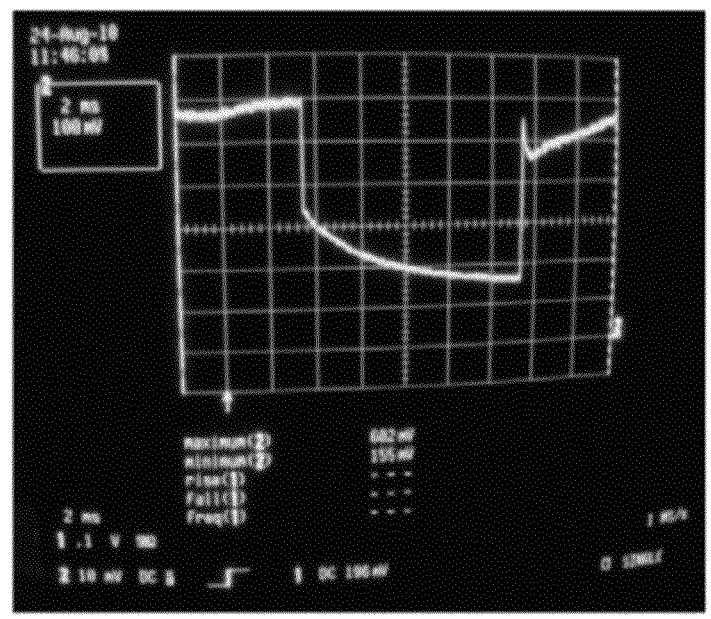
Figure 13A:
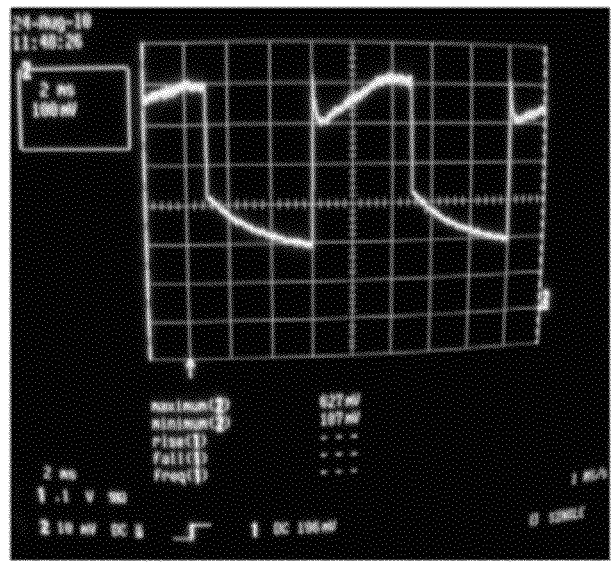
FIGS. 13A and 13B is the decay curve of the exemplary $Ca_{8-x}Eu_xMg_{1-y}Mn_y(SiO_4)_4Cl_2$ (x=0.16, y=0.4), where a red phosphor has been included to illustrate white LED performance (CCT=3000K), and where data was measured with two on-off time intervals of 5 millisecond and 10 millisecond, respectively, in FIGS. 13A and 13B.
Figure 13B:
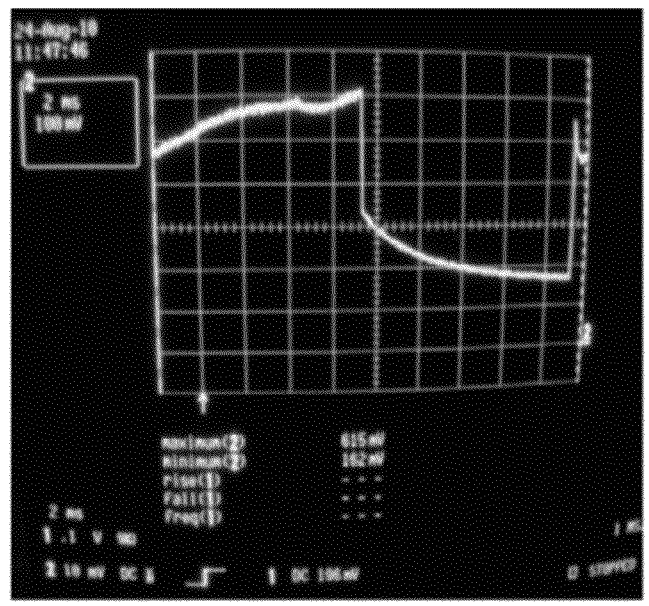
Figure 14:
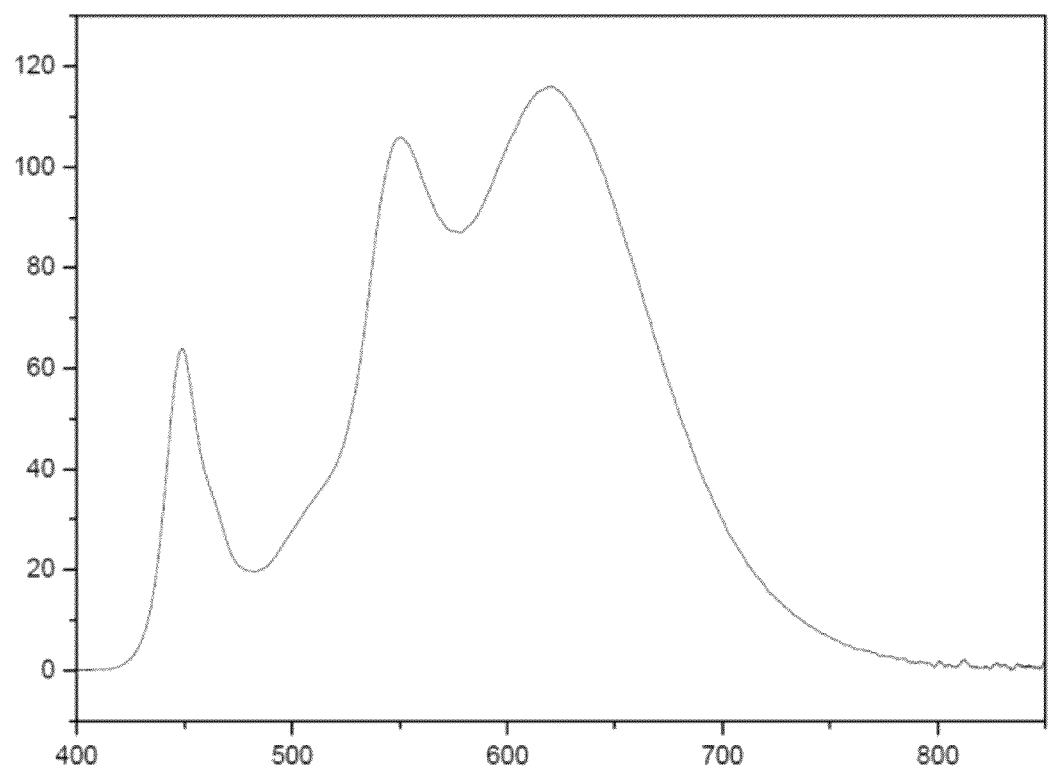
FIG. 14 shows a series of emission spectra produced by the exemplary chlorosilicates $Ca_{8-x}Eu_xMg_{1-y}Mn_y(SiO_4)_4Cl_2$ (x=0.16, y=0.4) emitting in conjunction with a red phosphor to produce white light (CCT=3000K) having the color coordinates CIE x=0.495, and CIE y=0.486.

FIG. 12 is the decay curve of the exemplary $Ca_{8-x}Eu_xMg_{1-y}Mn_y(SiO_4)_4Cl_2$ (x=0.16, y=0.4) where a red phosphor has been included to illustrate the CCT 5100K white LED performance. The test method is the same as the one previously described in FIG. 9. The decay curve is clearly observable even with the presence of the red phosphor. By applying a square wave current to the LED at 5 millisecond intervals (FIG. 12a) and 10 millisecond intervals (FIG. 12b), the intensity of the LED emission is 26.4% and 25.7%, respectively, at the end of each cycle;

FIG. 13 is the decay curve of the exemplary $Ca_{8-x}Eu_xMg_{1-y}Mn_y(SiO_4)_4Cl_2$ (x=0.16, y=0.4), where a red phosphor has been included to illustrate the CCT 3000K white LED performance. The test method is the same as the one previously described in FIG. 9. By applying a square wave current to the LED at 5 millisecond intervals (FIG. 13a) and 10 millisecond intervals (FIG. 13b), the intensity of the LED emission is 29.8% and 26.3%, respectively, at the end of each cycle;

FIG. 14 shows a series of emission spectra produced by the exemplary chlorosilicates $Ca_{8-x}Eu_xMg_{1-y}Mn_y(SiO_4)_4Cl_2$ (x=0.16, y=0.4) emitting in conjunction with a red phosphor to produce white light (CCT=3000K) having the color coordinates CIE x=0.495, and CIE y=0.486. This data shows that when the inventive chlorosilicates are combined with red light from a red-emitting phosphor, and blue light from a blue-emitting LED, the resultant light is white light.

Figure 15:
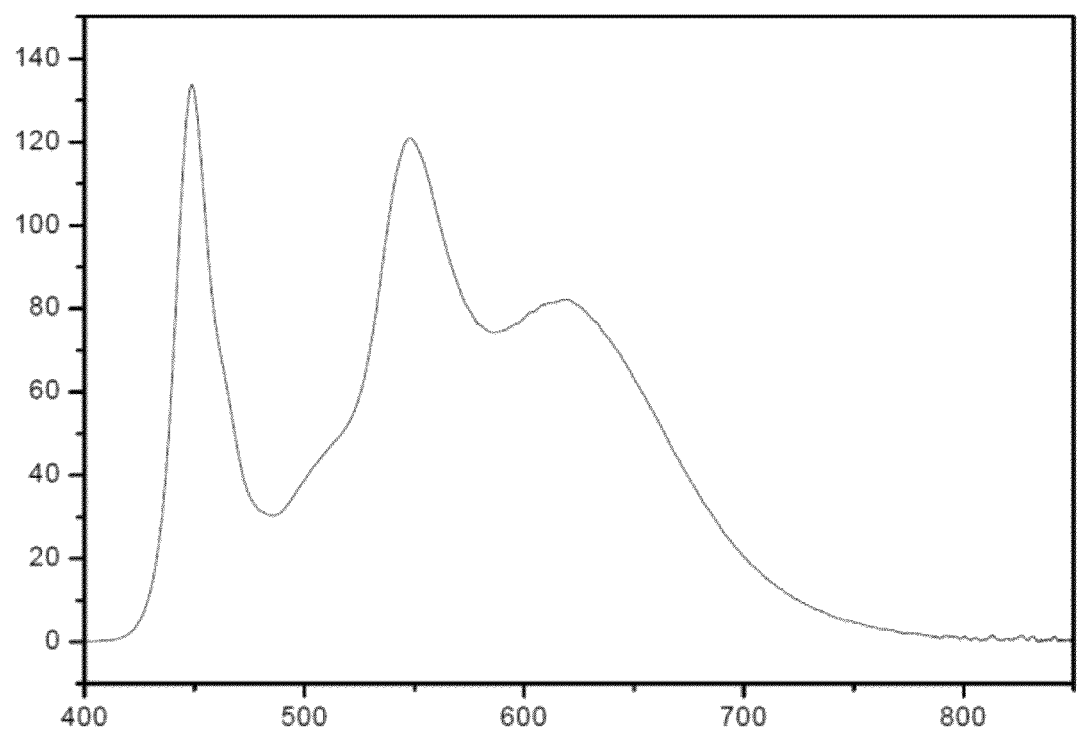
FIG. 15 shows a series of emission spectra produced by the exemplary chlorosilicates $Ca_{8-x}Eu_xMg_{1-y}Mn_y(SiO_4)_4Cl_2$ (x=0.16, y=0.4) emitting in conjunction with a red phosphor to produce white light (CCT=5100K) having the color coordinates CIE x=0.451, and CIE y=0.522.

FIG. 15 shows a series of emission spectra produced by the exemplary chlorosilicates $Ca_{8-x}Eu_xMg_{1-y}Mn_y(SiO_4)_4Cl_2$ (x=0.16, y=0.4) emitting in conjunction with a red phosphor to produce white light (CCT=5100K) having the color coordinates CIE x=0.451, and CIE y=0.522. This data shows that when the inventive chlorosilicates are combined with red light from a red-emitting phosphor, and blue light from a blue-emitting LED, the resultant light is white light.

Figure 16A:
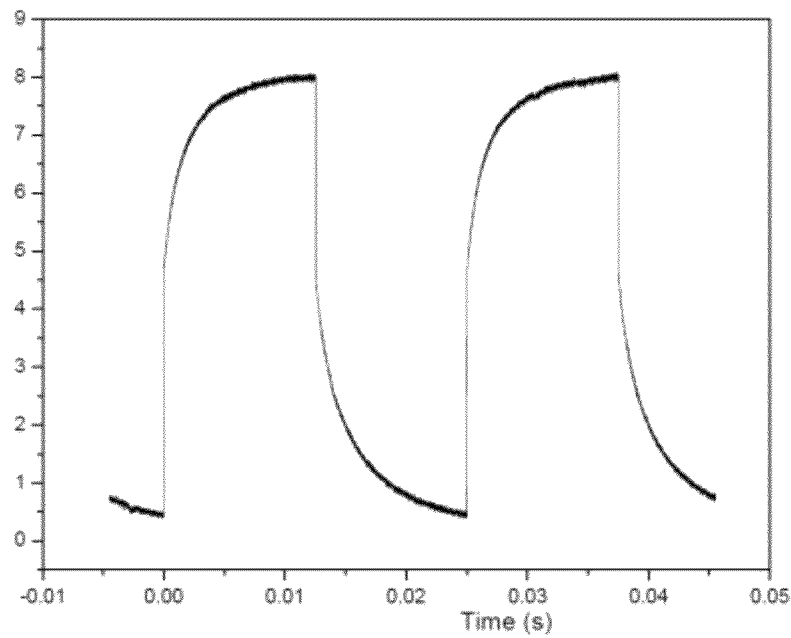
FIG. 16 shows the decay of the exemplary $Ca_{8-x}Eu_xMg_{1-y}Mn_y(SiO_4)_4Cl_2$ at 100 Hz, where x is held constant 0.3 in these two experiments: y=0.4 in one configuration (FIG. 16a) and y=0 in another (FIG. 16b)
Figure 16B:
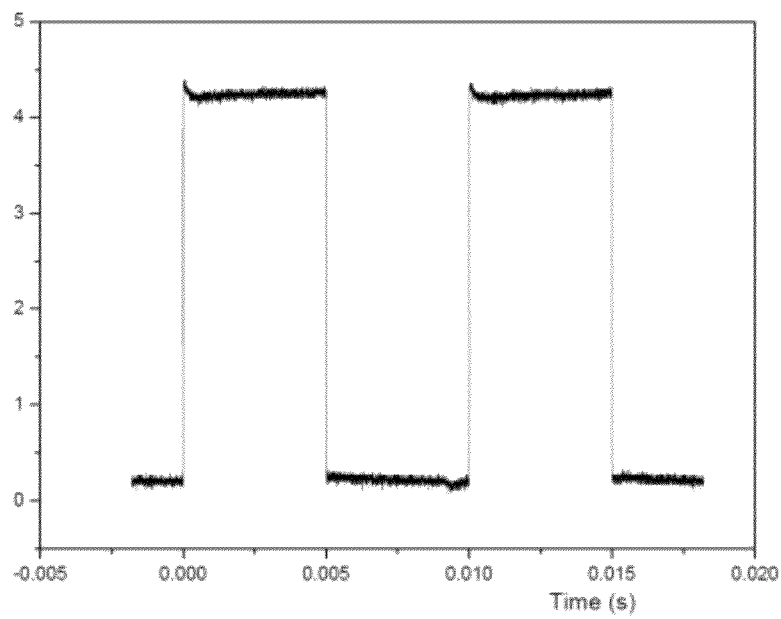

FIG. 16 shows the decay of the exemplary $Ca_{8-x}Eu_xMg_{1-y}Mn_y(SiO_4)_4Cl_2$ at 100 Hz, where x is held constant 0.3 in these two experiments: y=0.4 in one configuration (FIG. 16a) and y=0 in another (FIG. 16b). The data shows that without Mn, the emission of the invention decreases sharply, while when Mn ions are present in the host, the emission decays in the millisecond range.

Figure 17:
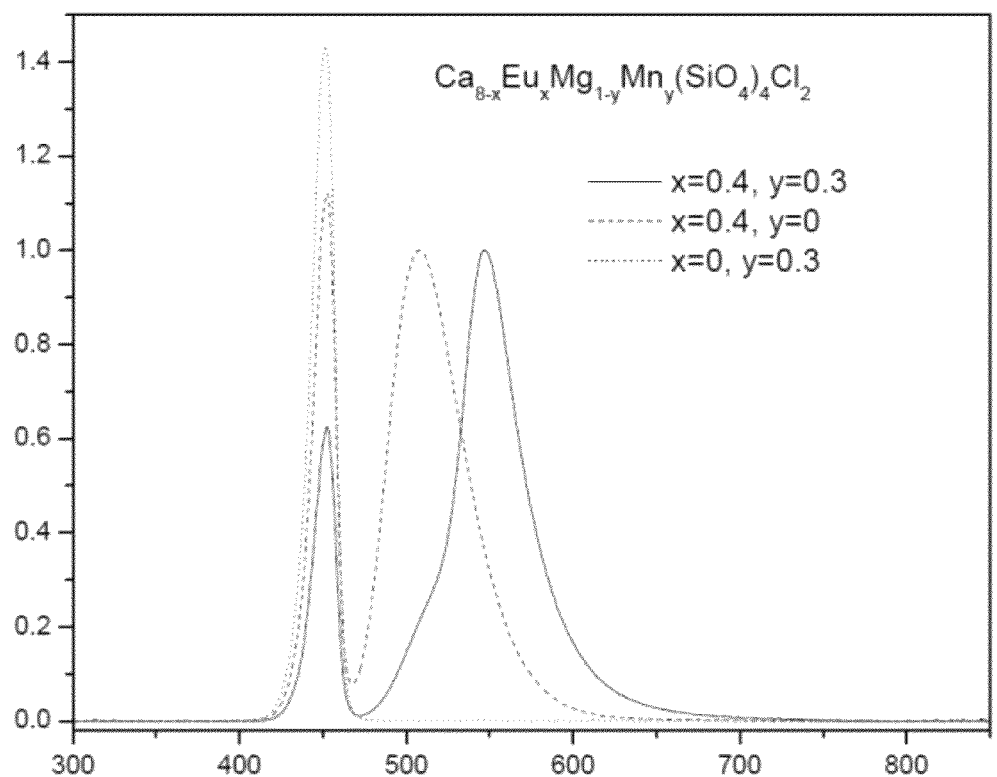
FIG. 17 shows three emission spectra of the inventive chlorosilicates where one sample contains $Eu^{2+}$ but no $Mn^{2+}$; a second sample contains $Mn^{2+}$ ions but no $Eu^{2+}$ ions, and the third sample contained both kinds of ions.
Figure 18:
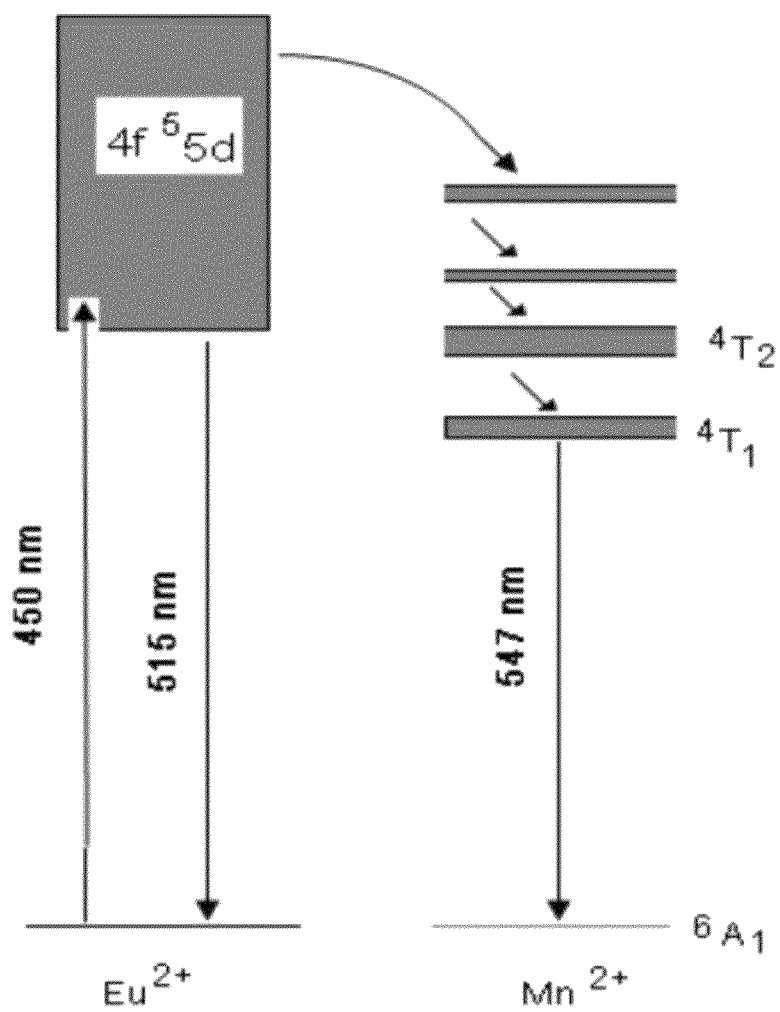
FIG. 18 shows graphically the energy transfer machanism of $Eu^{2+} \rightarrow Mn^{2+}$.

FIG. 17 is an emission spectrum of the exemplary $Ca_{8-x}Eu_xMg_{1-y}Mn_y(SiO_4)_4Cl_2$ where three configurations were studied. In the first configuration, x=0.4 and y=0.3, so in this sample both $Eu^{2+}$ and $Mn^{2+}$ ions were present. In the second configuration, x=0.4 and y=0, so this sample had $Eu^{2+}$ present but no $Mn^{2+}$ ions. In the third configuration, x=0 and y=0.3, so this sample had $Mn^{2+}$ ions present but no $Eu^{2+}$ ions. The emission of $Eu^{2+}$ at around 515 nm can only be observed when there are no $Mn^{2+}$ ions in the host, and no emission is observed if only $Mn^{2+}$ ions are doped into the host. The emission of 547 nm light, which is assigned to the emission of $Mn^{2+}$, can only be observed when Eu ions are co-doped in the host. One of ordinary skill in the art will also note that in the $Eu^{2+}$ and $Mn^+$ co-doped host, little emission, or perhaps only a weak emission of Eu 515 nm can be observed. This implies that the presence of $Eu^{2+}$ ions in the host are necessary in order to accomplish a transfer of energy to the $Mn^{2+}$ ions.

Synthesis

A number of methods may be used to synthesize the present green-emitting phosphors, which may be chlorosilicates, including solid state reaction methods, and liquid mixing method. Liquid mixing include such methods as co-precipitation and sol-gel techniques.

One embodiment of preparation involves a preparing a liquid reaction comprising the following steps:

The starting materials of $Ca(NO_3)_2 \cdot 4H_2O$, $Mg(NO_3)_2 \cdot 6H_2O$, $NH_4Cl$ were dissolved into 500 ml DI water, then add 33.5 ml 10.6% Eu(NO3)3 solution. The water was maintained at 60° C. and stirred;

Add 6.37 gram Mn(NO$_3$)2.4H2O until dissolved in the above solution;

Add 76.2 gram 20% aerodisp into the above solution;

Add 75 gram oxalic acid;

Bake until dry;

Calcination at 1100° C.

Then, the above mixture was heated to 1000-1400°.

What is claimed is:

1. A millisecond decay phosphor for AC LED lighting, wherein the composition comprises $Ca_{8-x-y}A_xEu_yMg_{1-m-n}B_mMn_n(Si_{1-s}C_sO_4)_4R_2$, where:

A is at least one divalent cation including Ca, Sr, Ba, individually or in combinations;

B is at least one of Zn or Cd;

C is at least one of Ge, Al, B, Gd, Ga, or N, individually or in combinations;

R is at least one of F, Cl, Br, I, individually or in combinations;

the sum of the parameters x+y is any value less than about 8;

the sum of the parameters m+n is any value less than about 1; and the value of the s parameter is any value less than about 1.

2. The millisecond decay phosphor of claim 1, wherein the phosphor is configured to emit yellow-green light in a wavelength ranging from about 500 nm to about 560 nm in response to an excitation source emitting at about 400 nm to about 480 nm.

3. The millisecond decay phosphor of claim 1, wherein the phosphor emits light in the yellow-green region of the spectrum with a peak emission ranging from about 507 nm to about 555 nm.

4. The millisecond decay phosphor of claim 1, wherein light emitted by the phosphor has a decay time ranging from about 1 ms to about 10 ms.

5. A white light lighting system comprising:
a plurality of LEDs configured to be directly operable from an AC power supply and which generate blue excitation light; and
at least one photoluminescence material configured to absorb at least a part of the excitation light and in response emit yellow and/or green light;
wherein the photoluminescence material comprises the millisecond decay phosphor of claim 1 and has a decay time of at least 1 ms.

6. The lighting system of claim 5, wherein the photoluminescence material has a decay time of at least 10 ms.

7. The lighting system of claim 5, wherein the photoluminescence material is configured such that the decay time of the material reduces flicker in emitted light.

8. The lighting system of claim 7, wherein the LEDs are configured as a part of a bridge rectifier arrangement.

9. The lighting system of claim 7, wherein the LEDs are configured as at least two strings of serially connected LEDs, wherein the strings are connected in parallel and in an opposite polarity.

10. The lighting system of claim 5, wherein the photoluminescence material has the formula $Ca_{8-x}Eu_xMg_{1-y}Mn_y(SiO_4)_4Cl_2$, where the x is 0.2, and y is 0.4.

11. The lighting system of claim 5, wherein the photoluminescence material is provided remotely to the plurality of LEDs.

12. The lighting system of claim 5, wherein the photoluminescence material is provided on a light emitting surface of at least one of the plurality of LEDs.

13. The lighting system of claim 5, wherein the device is drivable from a sinusoidal or a square wave drive.

14. A white light lighting system comprising:
a plurality of LEDs configured to be directly operable from an AC power supply having a drive cycle and which generate blue excitation light; and
at least one photoluminescence material configured to absorb at least a part of the excitation light and in response emit yellow and/or green light;
wherein the photoluminescence material comprises the millisecond decay phosphor of claim 1 and the modulation depth of light emitted by the photoluminescence material over a single drive cycle is less than about 75%.

15. The lighting system of claim 14, wherein the photoluminescence material is selected such that the modulation depth of light emitted by the photoluminescence material over a single drive cycle is less than about 50%.

16. The lighting system of claim 14, wherein the photoluminescence material is selected such that the modulation depth of light emitted by the photoluminescence material over a single drive cycle is less than about 25%.

17. The lighting system of claim 14, wherein the photoluminescence material is provided on a light emitting surface of at least one of the plurality of LEDs.

18. The lighting system of claim 14, wherein the device is drivable from a sinusoidal or a square wave drive.

19. The lighting system of claim 14, wherein the photoluminescence material has the formula $Ca_{8-x}Eu_xMg_{1-y}Mn_y(SiO_4)_4Cl_2$, where the x is 0.2, and y is 0.4.

20. The lighting system of claim 14, wherein the LEDs are configured as a part of a bridge rectifier arrangement.

21. The lighting system of claim 14, wherein the LEDs are configured as at least two strings of serially connected LEDs, wherein the strings are connected in parallel and in an opposite polarity.

22. A phosphor for AC LED lighting, wherein the phosphor is co-activated with manganese and europium, wherein the phosphor has a decay time of at least 1 ms, and wherein the phosphor comprises the millisecond decay phosphor of claim 1.

23. The phosphor of claim 22, wherein the phosphor comprises a chlorosilicate-based phosphor.

24. A photoluminescence wavelength conversion component for an AC LED light system comprising a photoluminescence material having a decay time of at least 1 ms, and wherein the photoluminescence material comprises the millisecond decay phosphor of claim 1.

25. The component of claim 24, wherein the component is selected from the group consisting of being: a substantially planar light transmissive component; a solid three dimensional light transmissive component and a hollow three dimensional light transmissive component.

26. The component of claim 25, selected from the group consisting of: the photoluminescence material being incorporated within the component and the photoluminescence material being provided as at least one layer on a surface of the component.

27. The component of claim 24, wherein the photoluminescence material comprises a phosphor co-activated with manganese and europium.

28. A white light emitting device comprising:
a composition comprising $Ca_{8-x-y}A_xEu_yMg_{1-m-n}B_mMn_n(Si_{1-s}C_sO_4)_4R_2$, where:
A is at least one divalent cation including Ca, Sr, Ba, individually or in combinations;
B is at least one of Zn or Cd;
C is at least one of Ge, Al, B, Gd, Ga, or N, individually or in combinations;
R is at least one of F, Cl, Br, I, individually or in combinations;
the sum of the parameters x+y is any value less than about 8;
the sum of the parameters m+n is any value less than about 1; and
the value of the s parameter is any value less than about 1.

* * * * *